(12) United States Patent
Endou et al.

(10) Patent No.: US 7,943,193 B2
(45) Date of Patent: May 17, 2011

(54) MAGNETIC RECORDING MEDIUM WITH DIAMOND-LIKE CARBON PROTECTIVE FILM, AND MANUFACTURING METHOD THEREOF

(75) Inventors: Naoto Endou, Kanagawa (JP); Shigehiko Fujimaki, Tokyo (JP); Hiroyuki Matsumoto, Kanagawa (JP); Toshinori Ono, Tokyo (JP)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 876 days.

(21) Appl. No.: 11/254,073

(22) Filed: Oct. 18, 2005

(65) Prior Publication Data
US 2006/0083952 A1  Apr. 20, 2006

(30) Foreign Application Priority Data

Oct. 18, 2004  (JP) ................. 2004-303081

(51) Int. Cl.
*C23C 16/00* (2006.01)
*H05H 1/24* (2006.01)
(52) U.S. Cl. ............... 427/249.7; 427/248.1; 427/249.1; 427/569; 427/131; 427/906
(58) Field of Classification Search .............. 427/569
See application file for complete search history.

(56) References Cited

U.S. PATENT DOCUMENTS

| | | | | |
|---|---|---|---|---|
| 4,647,494 A | * | 3/1987 | Meyerson et al. | 428/216 |
| 5,147,822 A | * | 9/1992 | Yamazaki et al. | 438/127 |
| 5,534,324 A | * | 7/1996 | Sugita et al. | 428/829 |
| 5,567,524 A | * | 10/1996 | Ishida et al. | 428/408 |
| 5,750,210 A | * | 5/1998 | Schmidt et al. | 427/577 |
| 6,258,434 B1 | * | 7/2001 | Hayashi | 428/835 |
| 6,316,062 B1 | * | 11/2001 | Sakaguchi et al. | 427/570 |
| 6,586,086 B1 | * | 7/2003 | Tsuchida | 428/323 |
| 2001/0048568 A1 | * | 12/2001 | Ikeda et al. | 360/59 |
| 2002/0127433 A1 | * | 9/2002 | Shimizu et al. | 428/694 TM |
| 2003/0053262 A1 | * | 3/2003 | Clayton et al. | 360/266.6 |
| 2003/0219630 A1 | * | 11/2003 | Moriwaki et al. | 428/694 R |
| 2004/0067390 A1 | * | 4/2004 | Koda et al. | 428/694 T |

FOREIGN PATENT DOCUMENTS

| | | |
|---|---|---|
| JP | 04-090125 A | 3/1992 |
| JP | 2002-358615 | 12/2002 |
| JP | 204-030803 | 1/2004 |
| JP | 2004-015462 A | 1/2004 |
| JP | 2004-030803 | 1/2004 |
| JP | 2004030803 A * | 1/2004 |
| JP | 2004-118894 | 4/2004 |
| JP | 2004-227666 | 8/2004 |

* cited by examiner

*Primary Examiner* — David Turocy
(74) *Attorney, Agent, or Firm* — Zilka-Kotab, PC

(57) ABSTRACT

Embodiments of the invention provide a magnetic recording medium superior in terms magnetic head flying performance, abrasion resistant reliability and corrosion resistance and a method for manufacturing the same. In one embodiment, method for manufacturing a magnetic recording medium, comprising forming at least an adhesion layer, a soft magnetic layer, a granular magnetic film and a diamond-like carbon (DLC) protective film on a nonmagnetic substrate. While the DLC protective film layer to protect the granular magnetic layer of the magnetic recording medium is formed, hydrocarbon gas is mixed with hydrogen gas and a bias voltage is applied to the substrate.

7 Claims, 6 Drawing Sheets

MAGNETIC RECORDING MEDIUM WITH DIAMOND-LIKE CARBON PROTECTIVE FILM, AND MANUFACTURING METHOD THEREOF

CROSS-REFERENCES TO RELATED APPLICATIONS

This application claims priority from Japanese Patent Application No. JP2004-303081, filed Oct. 18, 2004, the entire disclosure of which is incorporated herein by reference.

BACKGROUND OF THE INVENTION

The present invention relates to a perpendicular magnetic recording medium and a method for manufacturing the same. In particular, the invention relates to a magnetic recording medium capable of high reliability and high density magnetic recording and a method for manufacturing the same.

Used as storage devices of mainframes, workstations, personal computers, and the like, magnetic disk drives have been becoming more important year by year with advancement in storage capacity and compactness. To allow a magnetic disk drive to have a larger storage capacity in a compacter body, it is necessary to raise the recoding density. Accordingly, commercialization of perpendicular magnetic recording drives is earnestly awaited since the perpendicular magnetic recording system allows higher recording densities than the conventional longitudinal magnetic recording system. As a magnetic recording medium, some perpendicular magnetic recording systems use a laminate of an adhesion layer, a soft magnetic layer, an intermediate layer and a granular magnetic layer formed on a rigid nonmagnetic glass or aluminum substrate plated with nickel-phosphorus.

Conventionally, a magnetic recording medium manufactured by using sputtering film deposition process is provided with a diamond-like carbon (DLC) protective film to protect the magnetic films from the sliding magnetic head. Such a DLC protective film is thinned down to 5 nm or thinner. Recently, it is also common to use a perfluoropolyether liquid lubricant on the protective layer to reduce friction between the magnetic head and the magnetic recording medium.

In Patent Document 1 (Japanese Patent Laid-Open No. Hei 4-90125), a DLC protective film is disclosed. Hydrocarbon radicals and hydrocarbon ions are deposited on a substrate by the chemical vapor deposition (CVD) method with hydrocarbon gas.

In addition, Patent Document 2 (Japanese Patent Laid-Open No. 2004-152462) discloses that reducing the hydrogen content of the DLC protective film to 35% or less is preferable when the flying performance of the magnetic head is taken into consideration.

In Patent Document 3 (Japanese Patent Laid-Open No. 2004-30803), a CVD method is disclosed which uses hydrocarbon-based gas and hydrogen to form a protective layer to protect a granular magnetic film on a nonmagnetic high polymer substrate. In addition, Patent Document 3 discloses that since a plastic substrate is used, applying no bias to the substrate is preferable.

BRIEF SUMMARY OF THE INVENTION

To improve the magnetic properties of a longitudinal magnetic recording medium, the substrate temperature is raised to 200 to 400° C. In the case of a granular magnetic layer for perpendicular magnetic recording, however, its magnetic properties cannot be improved if the temperature is higher than 75° C. The inventors of the present invention directed their attention to this point. In the case of a conventional longitudinal magnetic recording medium, a firmly solidified DLC film can be formed as a protective film left on the magnetic layer since weakly bonded hydrogen carbon radicals which have reached the substrate surface during the CVD process are desorbed due to the high substrate temperature as well as the sputtering effect of implanted hydrocarbon ions. In the case of a perpendicular magnetic recording medium using a granular magnetic layer, however, since the substrate temperature is as low as 75° C. at the highest, hydrocarbon radicals are hardly desorbed. It is therefore likely to quickly form a weakly solidified DLC film or a very soft polymer-like carbon (PLC) film which cannot satisfactorily serve as a protective layer. Such a protective layer cannot protect the magnetic layer from shocks given by the magnetic head and have a problem of poor corrosion resistance. In addition, since the hydrogen content of such a DLC or PLC film is higher than 40%, the flying performance of the magnetic disk may deteriorate.

Although these problems may be solved if the deposition rate could be slowed down by lowering the hydrocarbon gas flow, the lowest allowable gas pressure for a stable discharge constitutes a bottleneck. It is industrially difficult to steadily control the gas flow rate in a short period of 1 to 2 sec so that a very thin film of 5 nm or thinner is formed without lowering the gas pressure below the lowest discharge-allowing level. In addition, a DLC film formed by this approach cannot secure the magnetic head's flying performance and is insufficient in corrosion resistance and impact resistance.

Furthermore, if the exhaust conductance is lowered so as to maintain the pressure at the reduced gas flow rate, uniform deposition is not possible on the substrate since plasma is delocalized in some part of the chamber. In addition, since the hydrogen content of the protective film becomes about 40%, the magnetic head's flying performance cannot be improved.

The present invention was made to solve the aforementioned problems. The present invention is directed to a DLC protective layer which is formed to cover a granular magnetic film for perpendicular magnetic recording medium that is deposited at relatively low temperature. Since the present invention enables the steady control of DLC formation at much lower deposition rate, it is possible to form a tightly connected DLC protective layer which promotes corrosion resistance and abrasion resistance on the perpendicular magnetic recording medium. In addition, since the hydrogen content of the DLC protective layer is reduced to about 30% or less, the magnetic head is allowed to highly reliably fly on the perpendicular magnetic recording medium. The present invention provides such perpendicular magnetic recording medium and its manufacturing method.

The following summarizes a representative aspect of the invention disclosed in this application. On a magnetic recording medium, having at least an adhesion layer, a soft magnetic layer and a granular magnetic layer formed in this order on a nonmagnetic substrate, a diamond-like carbon (DLC) protective film is formed by the chemical vapor deposition (CVD) method with hydrocarbon gas and hydrogen gas while a bias voltage is applied to the substrate. The hydrocarbon gas comprises at least one of methane, ethane, ethylene and acetylene.

According to the present invention, it is possible to realize a low temperature deposition granular magnetic film-used perpendicular magnetic recording medium which is superior in terms of head flying performance, abrasion resistance and corrosion resistance.

DETAILED DESCRIPTION OF THE INVENTION

Along with the drawings, an embodiment of the present invention is described below.

Figure 1:
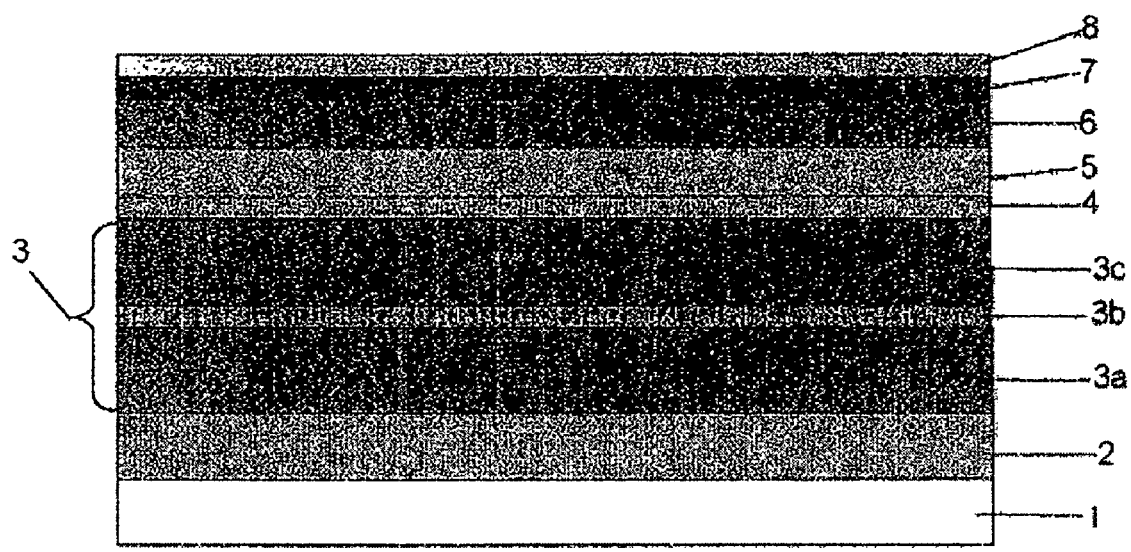
FIG. 1 is a schematic cross-sectional view of a perpendicular magnetic recording medium according to an embodiment of the present invention.

FIG. 1 schematically shows a cross section of a perpendicular magnetic recording medium according to an embodiment of the present invention. 1 refers to a nonmagnetic substrate, 2 is a NiTa adhesion layer, 3 is a soft magnetic layer, 3a is a CoTaZr lower soft magnetic layer, 3b is a Ru layer, 3c is CoTaZr upper soft magnetic layer, 4 is a Ta intermediate layer, 5 is a Ru intermediate layer, 6 is Co alloy granular magnetic layer, 7 is a protective film layer and 8 is a lubricant layer.

Figure 2:
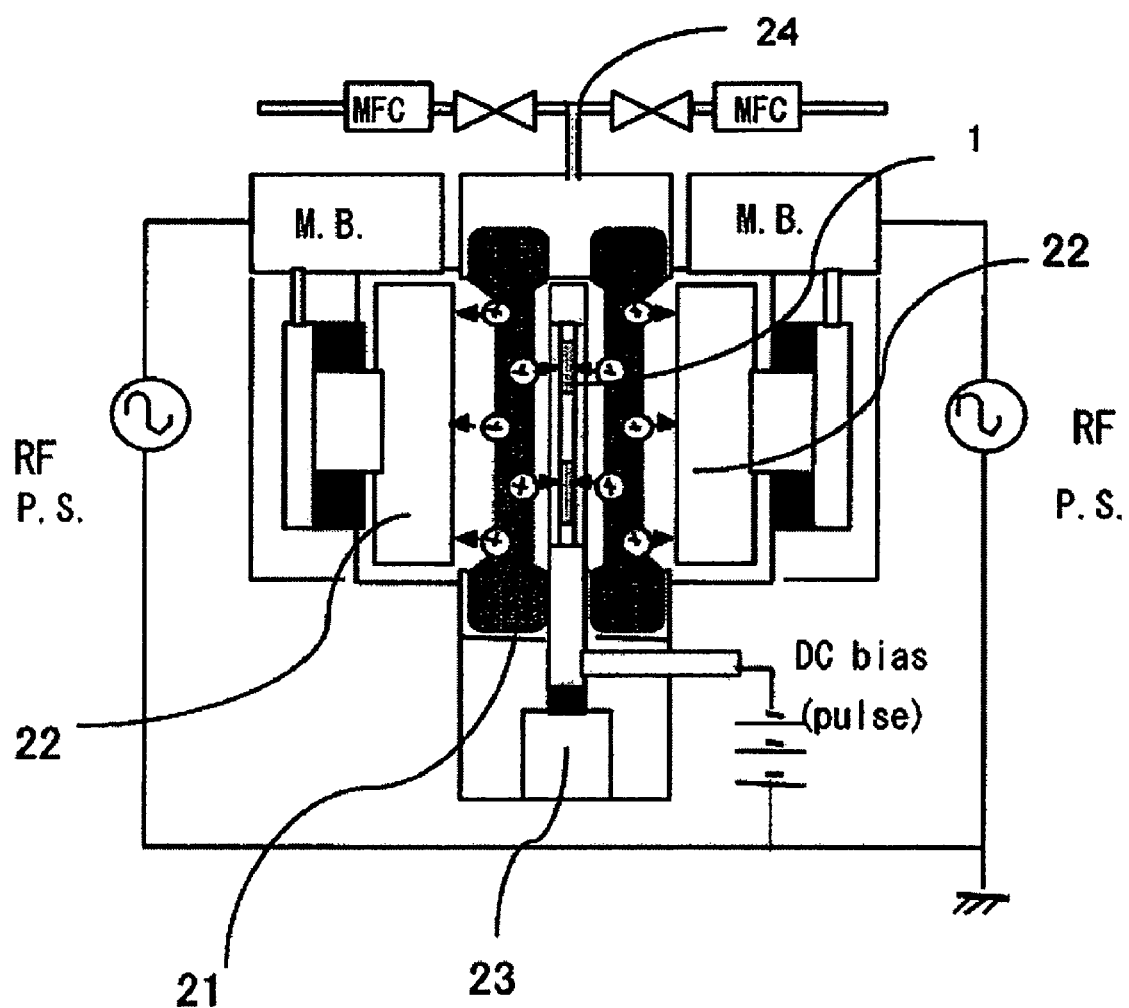
FIG. 2 is a schematic diagram of a protective film forming room.

FIG. 2 is a schematic diagram provided to explain the outline of a deposition system for the formation of a DLC protective layer on a granular magnetic layer of a perpendicular magnetic recording medium. Note that since the processes performed until the magnetic layer is formed on the nonmagnetic substrate follow the ordinary manufacturing procedure, their machines are not shown.

Firstly, a soda lime substrate 1 (outer diameter 65 mm, inner diameter 20 mm, thickness 0.8635 mm) was made enough clean and introduced into a vacuum chamber evacuated to approximately $1.3 \times 10E-5$ Pa ($1.0 \times 10E-7$ Torr). At first, the substrate 1 was loaded into an adhesion layer forming chamber where a 35 nm-thick Ni-37.5 at % Ta adhesion layer 2 was formed in Ar atmosphere at approximately 0.8 Pa (6 mTorr) by the DC magnetron sputtering method. Then, the substrate 1 was transferred into a lower soft magnetic layer forming chamber where a 60 nm-thick Cr-5 at % Ta-3 at % Zr alloy lower soft magnetic layer 3a was formed in Ar atmosphere at approximately 0.8 Pa (6 mTorr) by the DC magnetron sputtering method. Then, the substrate 1 was transferred into an antiferromagnetic bonding induction layer forming chamber where a 0.5 nm-thick Ru layer 3b was formed in Ar atmosphere at approximately 0.8 Pa (6 mTorr) by the DC magnetron sputtering method. Then, the substrate 1 is transferred into an upper soft magnetic layer forming chamber where a 60 nm-thick Cr-5 at % Ta-3 at % Zr alloy upper soft magnetic layer 3c was formed in Ar atmosphere at approximately 0.8 Pa (6 mTorr) by the DC magnetron sputtering method. Then, the substrate 1 was transferred into a substrate cooldown chamber where the substrate 1 heated due to the sputtering was cooled down to 60° C. Then, the substrate 1 was transferred into a Ta intermediate layer forming chamber where a 2 nm-thick Ta intermediate layer 4 was formed in Ar atmosphere at approximately 0.9 Pa (7 mTorr) by the DC magnetron sputtering method. Then, the substrate 1 was transferred into a Ru intermediate layer forming room where a 12 nm-thick Ru intermediate layer 5 was formed in Ar atmosphere at approximately 1.5 Pa (10 mTorr) by the DC magnetron sputtering method. Further, the substrate 1 was transferred into a magnetic recording layer forming chamber where a 20 nm-thick granular magnetic layer 6 of 90 mol % (Co-15 at % Cr-18 at % Pt) 10 mol $SiO_2$ alloy was formed in Ar atmosphere at approximately 0.9 Pa (7 mTorr) by the DC magnetron sputtering method. On the substrate 1 having this magnetic recording layer and lower layers formed thereon, the DLC protective film layer 7 containing hydrogen was formed according to the present invention as described below.

Preferably, the substrate 1 is a substrate capable of being given a bias voltage, for example, an Al—Mg alloy substrate plated nonelectrolytically. It is also possible to use a nonmagnetic rigid substrate made of such a ceramic as soda lime glass, chemically strengthened aluminosilicate, silicon or borosilicate glass or a glass-glazed ceramic. To use such substrates, means to make contact with a bias voltage is applied to the substrate through the electrode attached on an edge of the substrate after a metal film (granular magnetic film) is formed.

The adhesion layer 2 is formed to prevent the soda lime glass from eluting alkali metals and to improve adhesion between the glass and the soft magnetic layer. Its thickness is arbitrary. In addition, the adhesion layer 2 may be omitted if not necessary.

It is also possible to form a soft magnetic underlayer between the adhesion layer 2 and the soft magnetic layer 3. Typically, in this case, Ni-18 at % Fe (6 nm) and Fe-50 at % Mn (17 nm) are deposited in this order on the adhesion layer 2 before the soft magnetic layer 3 is formed. As the intermediate layer 4, it is also possible to use NiFe alloy, NiTa alloy, TaTi alloy or the like.

The substrate cooldown step may be performed either before forming the upper soft magnetic layer 3a or before forming the granular magnetic layer 6, instead of after forming the upper soft magnetic layer 3a. It is also possible to impose multiple shorter cooldown steps. Furthermore, the substrate cooldown step may be omitted if the substrate is at least so cooled down as not to deteriorate the magnetic properties of the granular magnetic layer to be formed.

Within the vacuum chamber, the substrate 1 having the magnetic layer 6 and lower layers formed thereon was transferred into a process chamber 21 to form the protective film layer. The protective film layer forming chamber 21 is equipped with RF (Radio Frequency) electrodes 22, which apply a RF power from a 13.56 MHz RF power supply via a matching circuit. The RF electrodes 22 are placed symmetrically with respect to the substrate 1 so that deposition can be done simultaneously on both sides of the substrate 1. Into this protective film layer forming chamber 21, being evacuated by a turbo-molecular pump 23, a hydrocarbon gas, such as ethylene ($C_2H_4$), and a hydrogen ($H_2$) gas are introduced through a gas feed port 24 on the top of the protective film layer forming chamber via a mass flow controller. Since the hydrocarbon gas is methane, ethane, ethylene, acetylene or the like which does not contain more than two carbon atoms per molecule, the deposition rate can be lowered so as to form a very thin film. With the flow rate of ethylene fixed to 130 sccm (standard cubic centimeters per minute), several different samples were prepared by changing the flow rate of hydrogen in the range of 0 to 150 sccm. During the deposition, the pressure in the protective film layer forming chamber was 2.0 to 3.5 Pa according to a Baratron gauge. According to our recognition, 2.0 Pa is the industrially lowest pressure at which plasma can be induced steadily in the protective film layer forming chamber by the radio frequency chemical vapor deposition (RF-CVD) method. We also prepared several different samples by changing the gas ratio of hydrogen to ethylene ($H_2/C_2H_4$) in the range of 0/1 to 3/1 while the pressure in the protective film layer forming chamber is kept at 2.0 Pa according to the Baratron gauge.

To generate plasma in preparing each sample, 1200 W began to be applied to the RF electrodes 0.5 sec after the gas began to be introduced. Concurrently, bias voltage −250 V was applied to edges of the substrate by setting them in contact with the aluminum alloy electrodes, not shown in the figure, which is isolated from the ground and the RF electrode. During this preparation, the RF electrodes had a self bias of −950 to −1050 V and a total current of 0.81 to 0.93 A flowed into the substrate and the substrate holder. By using this RF-CVD system whose plasma induction period is adjusted, the DLC protective film layer 7 containing hydrogen was formed to a thickness of 4.0 nm on the Co—Cr—Pt—$SiO_2$ granular alloy magnetic layer 6. Applying a bias to the substrate provides an ion implanting effect, making it possible to form a sufficiently hard DLC protective film of about 0.5 nm or less in thickness which secures sufficient flying performance for the magnetic head and has sufficient resistance to corrosion and abrasion.

Figure 3:
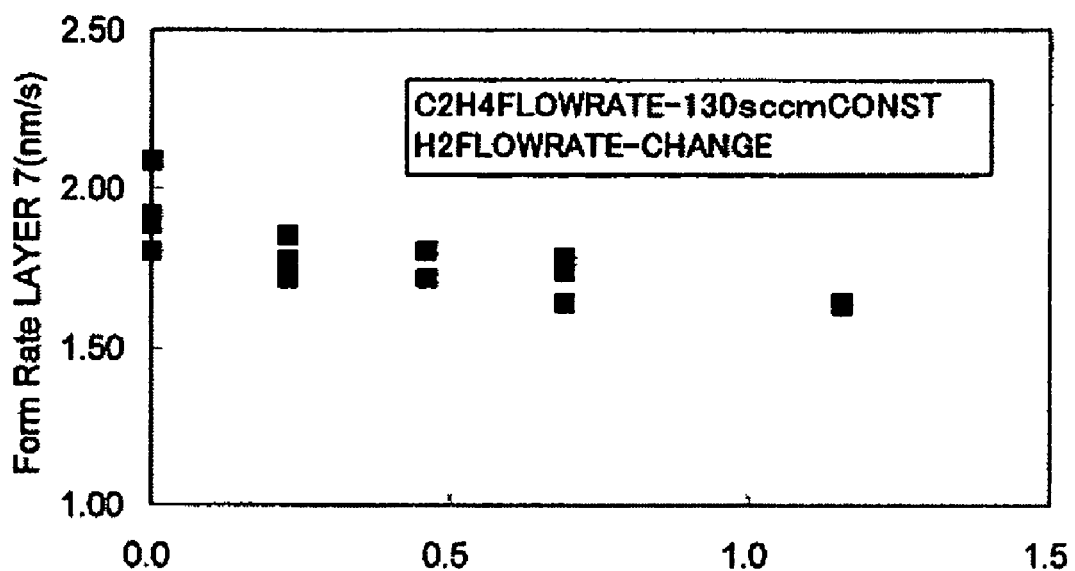
FIG. 3 is a graph of hydrogen/ethylene ratio and film forming speed.
Figure 4:
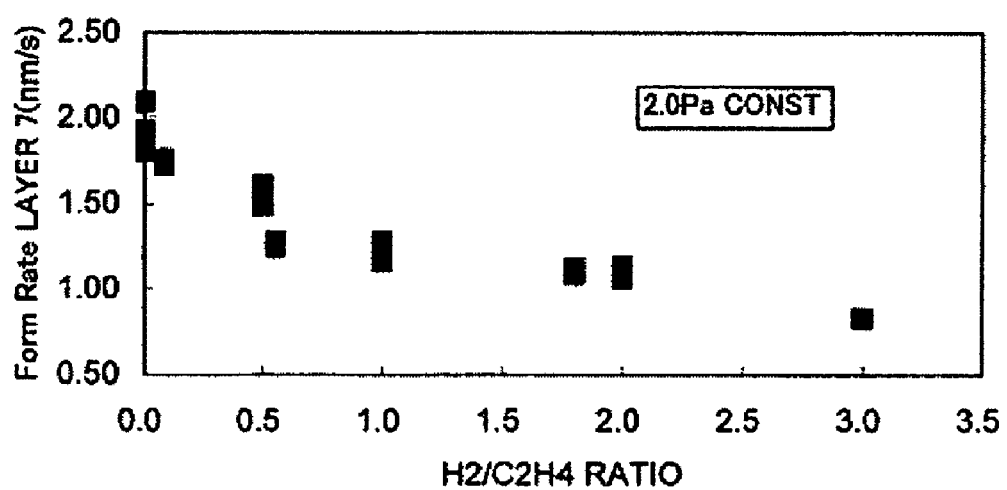
FIG. 4 is a graph of hydrogen/ethylene ratio and film forming speed.

For each sample, FIGS. 3 and 4 show how fast deposition advanced in the above-mentioned method. In FIG. 3, the flow rate of ethylene (C2H4FLOWRATE) was fixed at 130 sccm, whereas the flow rate of hydrogen (H2FLOWRATE) was varied from 0 to 150 sccm (hydrogen/ethylene flow rate ratio: 0/1 to 1.15). In this case, as the hydrogen/ethylene flow rate ratio (H2/C2H4 RATIO) increased, the film deposition rate (Form Rate LAYER 7) decreased from about 2.0 nm/s to about 1.6 nm/s. In FIG. 4, the pressure was kept at 2.0 Pa. In this case, according as the hydrogen/ethylene flow ratio (H2/C2H4 RATIO) increased from 0/1 to 3/1, the film deposition rate (Form Rate LAYER 7) decreased from about 2.0 nm/s to about 1.1 nm/s. That is, it was verified that when a DLC protective film layer is formed by RF-CVD with hydrocarbon gas, hydrogen incorporation is effective to lowering the film deposition rate.

The following describes the hydrogen content of each sample fabricated by the aforementioned method. Hydrogen content measurement was carried out by DSIMS (Dynamic Secondary Ion Mass Spectroscopy) with verification by HFS (Hydrogen Forward Scattering). The DSIMS measuring system used was the ADEPT1010 made by ULVAC-PHI, Inc. H/C ratios were calculated from the (133Cs2+1H)/(133Cs+12C) values obtained by the ADEPT1010. The measurement conditions were: Cs 350 V, 20 nA, measured area 700 um, extraction angle 80 degrees. For HFS, the high-resolution RBS analyzing system HRBS500 made by Kobe Steel, Ltd. was used. The measurement conditions were: beam energy 480 KeV, ion species N2+, scattering angle 30 degrees, beam incident angle 70 degrees with respect to the normal of the sample, sample current approximately 1.5 nA, beam irradiation amount approximately 310 nC, measured energy range 60 to 95 KeV. Hydrogen ions were detected by a magnetic sector-type detector. A known sample was used as the background.

Figure 5:
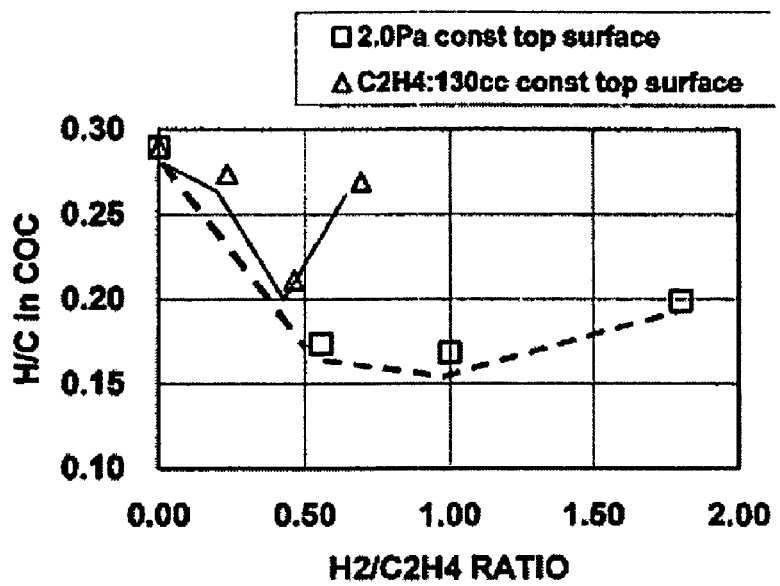
FIG. 5 is a graph of hydrogen/ethylene ratio and H/C in protective film layer.
Figure 6:
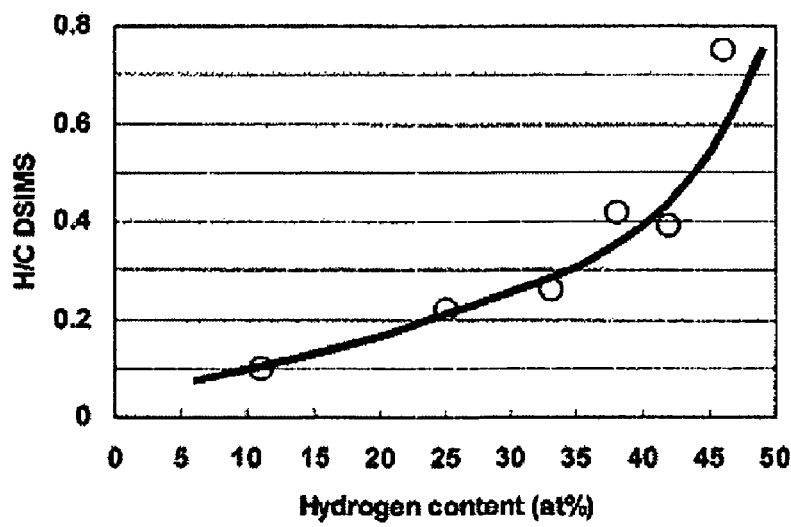
FIG. 6 is a graph of hydrogen content of protective film layer and H/C in protective film layer.

FIG. 5 shows how the hydrogen content of each sample film, prepared by the aforementioned method, depends on the flow rate of hydrogen. In FIG. 5, the flow rate of ethylene (C2H4FLOWRATE) is fixed at 130 sccm whereas the flow rate of hydrogen (H2FLOWRATE) is varied. As the hydrogen/ethylene flow rate ratio (H2/C2H4RATIO) increases from 0/1 to 0.5/1, the hydrogen to carbon ratio H/C decreases from 0.3 to 0.2. Then, as the hydrogen/ethylene flow rate ratio (H2/C2H4 RATIO) further increases from 0.5/1, the hydrogen ratio H/C increases again. Referring to FIG. 6 for verification, if hydrogen gas is not added, the hydrogen content of the protective film is approximately 35 at %. FIG. 6 also shows that the hydrogen content of the protective film can be decreased down to approximately 25% by mixing ethylene with hydrogen gas. Further, if the pressure is fixed at 2.0 Pa, the hydrogen to carbon ratio H/C decreases from 0.3 to 0.17 as the hydrogen/ethylene flow rate ratio increases 0/1 to 1.8/1. That is, the hydrogen content of the protective film can be decreased approximately from 35% to 20%. In specific embodiments of the present invention, a hydrogen content of less than about 30% is an important range that produces the desired result.

Further, a fluorocarbon-based lubricant layer 8 was formed on the DLC protective film 7 on each of some remaining sample disks prepared by the aforementioned method. Common to all samples, its thickness was controlled to 1.2 nm according to a Fourier Transform Infra-Red (FT-IR) spectroscopy system.

By using a plurality of disks each of which has such a fluorocarbon-based lubricant layer 8 formed thereon, evaluation was made regarding the head flying stability and regarding the reliability and corrosion resistance.

To evaluate properties of the magnetic recording medium concerning the flying stability, glide noise measurement was done with a head (glide head) having a piezoelectric transducer mounted thereon.

Glide noise (H_ave) is the noise output from the piezoelectric transducer while the glide head is flying over the magnetic recording medium. If H_ave is large, this means that the slider is not stably flying over the magnetic recording medium. H_ave measurement was done as follows. The glide head flying on the magnetic rotating medium was radially moved in steps of 0.05 mm between positions which are respectively 16.5 mm and 32.0 mm distant from the center. At each measurement position, noise from the piezoelectric transducer was measured for one rotation of the magnetic recording medium to obtain the average value. The glide noise of the magnetic recording medium wad defined as the value obtained by averaging the average noise values obtained at the respective measurement positions. The flying height of the glide head was 8 nm. Usually, the flying height changes if the speed of the glide head relative to the rotating magnetic recording medium changes. Therefore, to prevent the flying height from changing, each time the glide head was moved, the rotation speed of the magnetic recording medium was changed so as to keep the relative speed constant regardless of the radial position. The voltage from the piezoelectric transducer was output through an amplifier and a frequency discriminator. The gain of the amplifier is 60 dB (decibels) and the frequency discriminator passes 100 KHz to 2 MHz frequencies.

Figure 7:
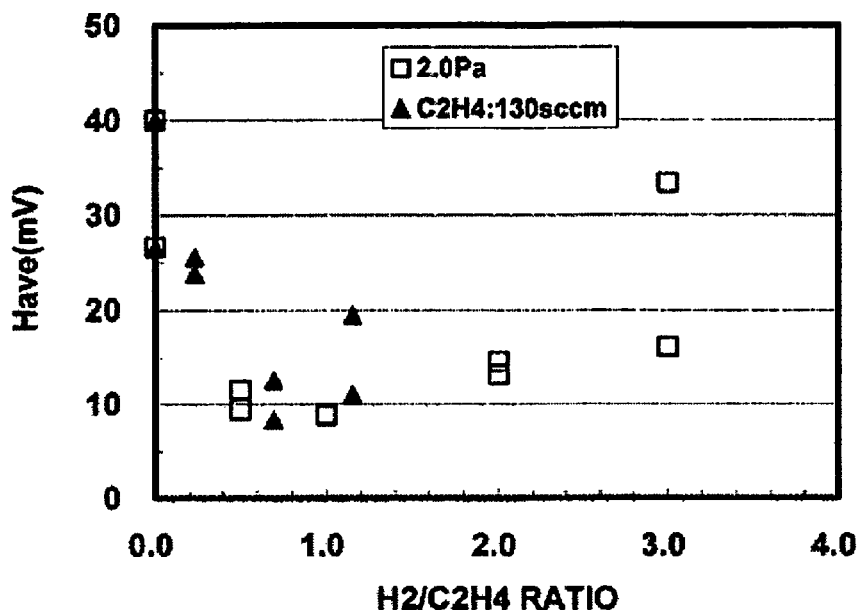
FIG. 7 shows the magnetic head flying performance evaluation result.

FIG. 7 shows the result of this evaluation. To put it briefly, the glide noise H_ave could be reduced by adding hydrogen gas. A particularly good result was obtained in the hydrogen/ethylene flow rate ratio (H2/C2H4 RATIO) range of about 0.5 to 2.0. If H_ave is higher than 25 mV, the disk does not allow a magnetic head to stably perform read/write operation.

To evaluate the reliability of the magnetic recording medium, its resistance to scratch damage was tested and measured. The test was done to measure the resistance to scratch damage as follows. Into a magnetic disk drive having a magnetic disk and magnetic head mounted therein, alumina powder with an average grain size of 0.2 μm was sprayed. The magnetic head was swept on the disk for five minutes. The flying height of the magnetic head was 10 nm, the head sweep frequency was 1 Hz and the speed of the magnetic disk was 4200 rotations min-1. Approximately 3 μg of the alumina powder, put in a sprayer, was sprayed from a height of about 10 cm above the surface of the magnetic disk surface installed in the magnetic disk drive. After then, white light is entered to the magnetic disk at 45 degrees. The scatter light from the disk surface was spatially resolved by a CCD and image-processed to count scratches which exceed a certain threshold.

Figure 8:
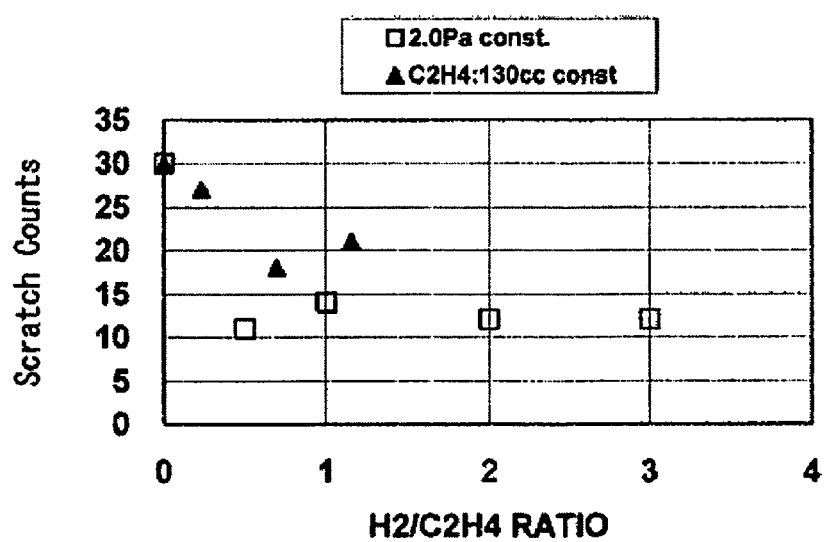
FIG. 8 shows the abrasion resistant reliability evaluation result.

FIG. 8 shows the result of this evaluation. To put it briefly, the scratch count could be decreased by adding hydrogen gas. A particularly good result was obtained with hydrogen/ethylene flow rate ratios (H2/C2H4 RATIO) beyond 0.5. The corrosion resistance of the magnetic recording medium was evaluated as follows. For four days, magnetic disks were left at 60° C. temperature and 95% relative humidity in a constant temperature/humidity chamber. Four days later, the magnetic disks were removed from the constant temperature/humidity chamber. By the Corrosion Analysis measurement of the Optical Surface Analyzer Model 2120 made by Candela Instruments of the U.S., corrosion counts on the surfaces of the magnetic disks were obtained.

Figure 9:
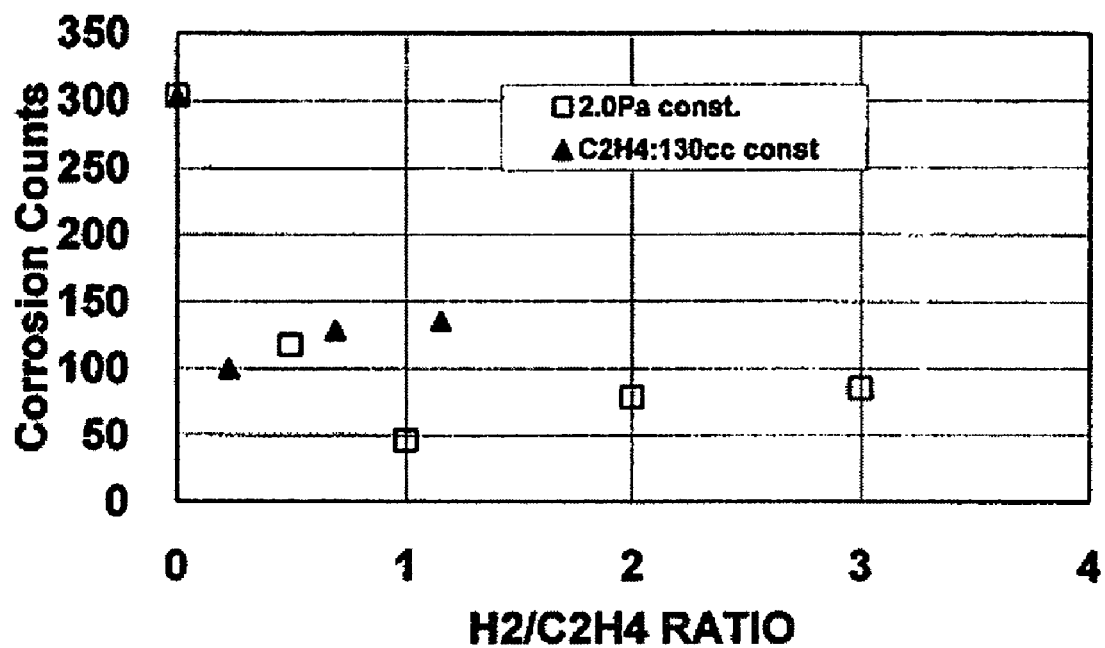
FIG. 9 shows the corrosion resistance evaluation result.

FIG. 9 shows the result of this evaluation. To put it briefly, the corrosion resistance could be improved by adding hydrogen gas. A particularly good result was obtained with hydrogen/ethylene flow rate ratios (H2/C2H4 RATIO) beyond 0.23.

The following summarizes the results mentioned above. By adding hydrogen gas to the hydrocarbon gas (ethylene) used to form the DLC protective film layer in the RF-CVD method, it is possible to suppress the deposition rate of the protective film layer and reduce the hydrogen content of the protective film layer. Adding hydrogen gas allows the flow rate of the material hydrocarbon gas to be reduced while steadily producing high density plasma. Hydrogen radicals and ions generated in plasma cut the comparatively weak C—H bonds which are mainly bonds and not chemical bonds existing on the reaction surface. Therefore if hydrogen radicals and ions are mass-generated in plasma and the reaction where comparatively weak bonds are eliminated from surface by the hydrogen radicals and ions is enhanced, it becomes possible to decrease layer forming rate and reduce the hydrogen content in the protection layer. Applying a bias voltage to the substrate also serves to suppress the film deposition rate and reduce the hydrogen content of the protective film layer since hydrogen ions in the plasma are accelerated by a bias voltage in the ion sheath region near the substrate and provide enough energy to remove or dissociate weakly bonded hydrocarbon radicals on the substrate. The surface reactions of Hydrogen radicals also contribute to dissociate C—H bonds on the surface of the substrates, and thus perform the same function as well although they are not accelerated in the sheath. Further, through granular magnetic layer-used perpendicular magnetic recording media prepared by the aforementioned method, it is proven that by setting $H_2/C_2H_4$ to about 0.5 to 2.0, it is possible to form a protective film layer of merely 4.0 nm in thickness which is superior in terms of head flying stability, abrasion resistant reliability and corrosion resistance.

It is to be understood that the above description is intended to be illustrative and not restrictive. Many embodiments will be apparent to those of skill in the art upon reviewing the above description. The scope of the invention should, therefore, be determined not with reference to the above description, but instead should be determined with reference to the appended claims alone with their full scope of equivalents.

What is claimed is:

1. A method for manufacturing a perpendicular magnetic recording medium, comprising forming at least an adhesion layer, a soft magnetic layer, a granular magnetic film and a diamond-like carbon protective film on a nonmagnetic substrate,
   wherein the diamond-like carbon protective film is formed by a CVD method in which ethylene gas and hydrogen gas are used in a volume ratio of the hydrogen gas to the ethylene gas ($H_2/C_2H_4$) of about 0.5 to 2 and a bias voltage is applied to the nonmagnetic substrate while the granular magnetic film is maintained at a temperature of 75° C. or less, wherein the diamond-like carbon protective film has a hydrogen content of less than about 25%, a thickness of the diamond-like carbon protective film being less than 0.5 nm.

2. The method for manufacturing a magnetic recording medium according to claim 1, further comprising:
   cooling down the substrate after the soft magnetic layer is formed; and
   forming an intermediate layer before forming the granular magnetic film.

3. The method for manufacturing a magnetic recording medium according to claim 1, further comprising forming a lubricant layer after the protective film is formed, wherein the nonmagnetic substrate is a glass substrate.

4. The method for manufacturing a magnetic recording medium according to claim 3, wherein:
   the soft magnetic layer comprises a first soft magnetic film, a second soft magnetic film and a Ru layer laid between the first soft magnetic film and the second soft magnetic film; and
   the granular magnetic layer contains cobalt, chromium, platinum and silicon dioxide.

5. The method for manufacturing a magnetic recording medium according to claim 1, wherein the diamond-like carbon protective film has a hydrogen content of less than about 20%.

6. The method for manufacturing a magnetic recording medium according to claim 1, wherein the diamond-like carbon protective film is continuously formed by the CVD method into a single continuous diamond-like carbon film.

7. The method for manufacturing a magnetic recording medium according to claim 1, wherein the diamond-like carbon protective film is a nonlaminated layer of diamond-like carbon.

* * * * *